(12) United States Patent
Wu et al.

(10) Patent No.: US 12,191,822 B2
(45) Date of Patent: Jan. 7, 2025

(54) HYBRID POWER SUPPLY-BASED HIGH-POWER LOUDSPEAKER BOX, AND POWER SUPPLYING METHOD FOR INCREASING POWER OF LOUDSPEAKER BOX

(71) Applicant: Zhao Han, Guangdong (CN)

(72) Inventors: Zhiming Wu, Guangdong (CN); Zhao Han, Guangdong (CN)

(73) Assignee: Shenzhen Hanke Technology Co., Ltd., Shenzhen (CN)

( * ) Notice: Subject to any disclaimer, the term of this patent is extended or adjusted under 35 U.S.C. 154(b) by 124 days.

(21) Appl. No.: 17/962,518

(22) Filed: Oct. 9, 2022

(65) Prior Publication Data

US 2024/0097625 A1 Mar. 21, 2024

(30) Foreign Application Priority Data

Sep. 16, 2022 (CN) .......................... 202211129120.2

(51) Int. Cl.
*H03F 3/21* (2006.01)
*H02J 7/00* (2006.01)

(52) U.S. Cl.
CPC .............. *H03F 3/21* (2013.01); *H02J 7/0063* (2013.01); *H03F 2200/03* (2013.01)

(58) Field of Classification Search
CPC ...... H03F 3/21; H03F 2200/03; H03F 1/0211; H03F 3/181; H02J 7/0063; H04R 2201/028; H04R 3/00; H04R 2430/00; H04R 29/00–004; H02M 3/156; H02M 1/0045

USPC ...... 381/58, 59, 96, 120, 123; 323/299, 271, 323/282

See application file for complete search history.

(56) References Cited

U.S. PATENT DOCUMENTS

| | | | |
|---|---|---|---|
| 7,852,150 B1 * | 12/2010 | Arknaes-Pedersen | H03F 1/0227 330/297 |
| 8,446,126 B2 * | 5/2013 | Cheng | H02J 7/00 381/26 |
| 10,581,397 B2 * | 3/2020 | Rombach | H03F 3/183 |
| 10,985,713 B2 * | 4/2021 | Patchin | H03F 1/0216 |
| 11,425,501 B2 * | 8/2022 | Kania | H04R 27/00 |
| 2001/0052758 A1 * | 12/2001 | Odaohhara | H02J 7/0013 429/61 |
| 2005/0047615 A1 * | 3/2005 | Kawamura | H03G 3/007 330/10 |

(Continued)

FOREIGN PATENT DOCUMENTS

| | | |
|---|---|---|
| CN | 106454623 A | 2/2017 |
| CN | 208754529 U | 4/2019 |
| CN | 113207063 A | 8/2021 |

*Primary Examiner* — Xu Mei

(57) ABSTRACT

Disclosed is a hybrid power supply-based high-power loudspeaker box, and a power-supplying method for increasing the power of the loudspeaker box. A battery power-supplying unit and a power supply power-supplying unit are arranged in a power supply management module to supply power for a power amplification unit, an audio input unit receives input audio, the power amplification unit amplifies an audio signal, and the amplified audio signal drives a loudspeaker to make a sound so as to meet high-power output of the loudspeaker box. The power-supplying method is suitable for the high-power loudspeaker box. High power exceeding the power supply power is output under a condition that a powered voltage of the power supply power-supplying unit is constant.

10 Claims, 2 Drawing Sheets

(56) References Cited

U.S. PATENT DOCUMENTS

2009/0016549 A1\* 1/2009 French ................... H03G 3/004
323/299
2019/0006855 A1\* 1/2019 MacDonald .......... H02J 7/0048

\* cited by examiner

HYBRID POWER SUPPLY-BASED HIGH-POWER LOUDSPEAKER BOX, AND POWER SUPPLYING METHOD FOR INCREASING POWER OF LOUDSPEAKER BOX

FIELD OF TECHNOLOGY

The present disclosure relates to a hybrid power supply-based high-power loudspeaker box, and a power supplying method for increasing the power of a loudspeaker box.

BACKGROUND

Loudspeaker box refers to a device that can convert an audio signal into make a sound. The loudspeaker has its own power amplifier (also referred to as a power amplification unit), which amplifies the audio signal and then drives the loudspeaker to produce sound, thereby making the sound louder.

At present, due to different power supplying modes of the loudspeaker boxes, the loudspeaker boxes can be divided into USB loudspeaker boxes, and loudspeaker boxes powered by main supplies and with adapters. The USB loudspeaker box is powered by USB and is a loudspeaker box device that receives the audio signal through Bluetooth or 3.5 interface and play the audio signal. The USB loudspeaker box mainly includes a power supply module, a sound input module, a power amplification module and a loudspeaker. After being input, the sound signal is amplified by the power amplification module to drive the loudspeaker to make a sound. The power amplification module needs to consume a large amount of electricity when amplifying the sound signal. For the convenience of use, the USB loudspeaker box is powered by a USB interface and can work when being directly plugged in a USB interface of a computer. According to the standard of the USB interface, the common USB interface can only output a current of 5V and 1.2 A maximally. That is, the USB loudspeaker box can only achieve the maximum output power of 6 W generally, so that the volume and sound quality of the USB loudspeaker box are greatly limited. Although there are various USB fast charging technologies, which can greatly improve the power supply capacity of the USB, the fast charging, technologies have different standards, and the common computer USB interface does not support any fast charging, so it is impossible to solve the power-supplying power bottleneck of the USB loudspeaker by the USB fast charging technology.

For the loudspeaker box powered by the mains supply and with the adapter, although the external 220V mains supply can provide any power and no power bottleneck is present, the price of the adapter in the loudspeaker box will increase with the increase of the corresponding power, resulting in high manufacturing cost of the high-power loudspeaker box. For example, a 18 W loudspeaker box needs to be configured with a 18 W adapter and the price of the 18 W adapter is about 18 yuan, and a 36 W loudspeaker box needs to be configured with a 36 W adapter and the price of the 36 W adapter is about 36 yuan. Therefore, how to use the low-power adapter to support the work of the high-power adapter so as to reduce the cost and solve the limitation bottleneck of the adapter on the power of the loudspeaker box has also been concerned by people.

Therefore, how to research and develop a method for increasing the power of a loudspeaker box, and the high-power loudspeaker box has become an urgent problem to be solved.

SUMMARY

In view of this, the present disclosure provides a hybrid power supply-based high-power loudspeaker box, and a power supplying method for increasing the power of a loudspeaker box, so as to solve the problem that an existing USB loudspeaker box is limited by power, resulting in limiting volume and sound quality, and the problem that a loudspeaker box provided with an adapter and powered by a mains supply, resulting in high manufacturing cost of the loudspeaker box.

According to one aspect, the present disclosure provides a hybrid power supply-based high-power loudspeaker box, including: an audio input unit, a power amplification unit, a loudspeaker, and a power supply management module, where the audio input unit is used to receive an input audio signal;

an input terminal of the power amplification unit is connected to an output terminal of the audio input unit, and is used to receive an audio signal output by the audio, input unit and amplify the audio signal;

an input terminal of the loudspeaker is connected to an output terminal of the power amplification unit, and the loudspeaker is driven by an amplified audio signal output by the power amplification unit to make a sound;

the power supply management module includes a power supply power-supplying unit, a battery power-supplying unit, and an FET control unit;

an input terminal of the power supply power-supplying unit is connected to an external power supply;

the battery power-supplying unit is connected to an output terminal of the power supply power-supplying unit after being connected in series with the FET control unit; and the power supply management module automatically switches a conducting state of the FET control unit according to a power amplification power required by the power amplification unit and the change of a system voltage corresponding to the power amplification unit, adjusts the working state of the battery power-supplying unit and the power supply power-supplying unit, and dynamically supplies power for the power amplification unit.

Preferably, the conducting state of the FET control unit includes: forward conduction, reverse conduction and non-conduction.

Further preferably, the power supply management module automatically switches a conducting state of the FET control unit according to a power amplification power required by the power amplification unit and the change of a system voltage corresponding to the power amplification unit, adjusts the working state of the battery power-supplying unit and the power supply power-supplying unit, and dynamically supplies power for the power amplification unit, which is specifically as follows:

when the power amplification power required by the power amplification unit is less than the power supply power, and a voltage difference between the system voltage corresponding to the power supply power-supplying unit and the voltage of the battery power-supplying unit is greater than or equal to a conducting threshold of the FET control unit the FET control unit is forwardly conducted, and the power supply power-supplying unit charges the battery power-supplying unit while supplying power for the power supply power-supplying unit;

when the power amplification power required by the power amplification unit is less than the power supply power, and the voltage difference between the system voltage corresponding to the power amplification unit and the voltage of the battery power-supplying unit is less than the conducting threshold of the FET control unit, the FET control unit is not conducted, and the power supply power-supplying unit supplies power only for the power amplification unit; and when the power amplification power required by the power amplification unit is greater than or equal to the power supply power, and a voltage difference between the voltage of the battery power-supplying unit and the system voltage corresponding to the power amplification unit, is greater than or equal to the conducting threshold of the FET control unit, the FET control unit is reversely conducted, and the power supply power-supplying unit and the battery power-supplying unit supply power for the power amplification unit.

The hybrid power supply-based high-power loudspeaker box further includes: a power supply power-supplying detection unit, where an input, terminal of the power supply power-supplying detection unit is connected to an input port of the power supply power-supplying unit and is used to detect whether a power supply current input to the power supply power-supplying unit is present; an output terminal of the power supply power-supplying detection unit is connected to a control terminal of the power amplification unit; and the power supply power-supplying detection unit controls whether the power amplification unit is allowed to be started according to the detected external power supply current state input by the power supply power-supplying unit.

Further preferably, the high-power loudspeaker box is a USB loudspeaker box or a loudspeaker box provided with an adapter and powered by a mains supply.

According to another aspect, the present disclosure further provides a hybrid power supply-based power supplying method for increasing the power of a loudspeaker, where a battery power-supplying unit and, a power supply power-supplying unit powered by an external power supply are arranged in the loudspeaker box.

The power supplying method includes the following steps:

acquiring an audio signal input by the loudspeaker box, and detecting a current value corresponding to the audio signal;

according to the current value corresponding to the audio signal and a power amplification factor of the loudspeaker box, calculating a power amplification power required by the loudspeaker box;

detecting a system voltage corresponding to a power amplification unit in the loudspeaker and a voltage of a battery power-supplying unit in the loudspeaker box in real time; and according to the power, amplification power required by the loudspeaker box, the system voltage corresponding to the power amplification unit in the loudspeaker box, and the voltage of the battery power-supplying unit in the loudspeaker box, controlling the working state of the battery power-supplying unit and the power supply power-supplying unit to dynamically supply power for the power amplification unit in the loudspeaker box.

Preferably, the step of according to the power amplification power required by the loudspeaker box, the system voltage corresponding to the power amplification unit in the loudspeaker box, and the voltage of the battery power-supplying unit in the loudspeaker box, controlling the working state of the battery power-supplying unit and the power supply power-supplying unit to dynamically supply power for the power amplification unit in the loudspeaker box is specifically as follows:

comparing the power amplification power required by the loudspeaker box with a rated power amplification power of the loudspeaker box to obtain a power comparison result;

comparing the system voltage corresponding to the power amplification unit in the loudspeaker box with the voltage of the battery power-supplying unit in the loudspeaker box to obtain a voltage comparison result; and according to the power comparison result and the voltage comparison result, controlling the working state of the battery power-supplying unit and the power supply power-supplying unit to dynamically supply power for the power amplification unit in the loudspeaker box.

Further preferably, the step of according to the power comparison result and the voltage comparison result, controlling the working state of the battery power-supplying unit and the power supply power-supplying unit to dynamically supply power for the power amplification unit in the loudspeaker box is specifically as follows:

when the power amplification power required by the loudspeaker box is less than the rated power amplification power of the loudspeaker box, and a voltage difference between the system voltage corresponding to the power amplification unit in the loudspeaker box and the voltage of the battery power-supplying unit is greater than or equal to a threshold, controlling the power supply power-supplying unit to charge the battery power-supplying unit while supplying power for the power amplification unit in the loudspeaker box;

when the power amplification power required by the loudspeaker box is less than the rated power amplification power of the loudspeaker box, and the voltage difference between the system voltage corresponding to the power amplification unit in the loudspeaker box and the voltage of the battery power-supplying unit is less than the threshold, controlling the power supply power-supplying unit to supply power only for the power amplification unit in the loudspeaker unit; and when the power amplification power required by the loudspeaker box is greater than or equal to the rated power amplification power of the loudspeaker box, and the voltage difference between the system voltage corresponding to the power amplification unit, in the loudspeaker box and the voltage of the battery power-supplying unit is greater than or equal to the threshold, controlling both the power supply power-supplying unit and the battery power-supplying unit to supply power for the power amplification unit in the loudspeaker box.

Further preferably, the hybrid power supply-based power supplying method for increasing the power of the loudspeaker box further includes the following steps:

detecting an input power supply current of the power supply power-supplying unit in the loudspeaker box, and when the input power supply current is greater than a current threshold, allowing the power amplification unit in the loudspeaker unit to be started, otherwise, not allowing the power amplification unit in the loudspeaker box to be started.

Further preferably, the high-power loudspeaker box is a USB loudspeaker box or a loudspeaker box provided with an adapter and powered by a mains supply.

According to the hybrid power supply-based high-power loudspeaker box provided by the present disclosure, a battery power-supplying unit and a power supply power-supplying unit are arranged in a power supply management module to supply power for a power amplification unit. When the loudspeaker box works, an audio input unit receives input audio, the power amplification unit amplifies an audio signal, and the amplified audio signal drives a loudspeaker to make a sound, where the FET control unit in the power supply management module automatically switches a conducting state according to the power amplification power required by the power amplification unit and the change of the system voltage corresponding to the power amplification unit, adjusts the power supplying states of the battery power-supplying unit and the power supply power-supplying unit, and dynamically supplies power for the power amplification unit so as to meet high-power output of the loudspeaker box.

According to the hybrid power supply-based power supplying method for increasing the power of the loudspeaker box provided by the present disclosure, the working states of the battery power-supplying unit and the power supply power-supplying unit are controlled according to the power amplification power required by the loudspeaker box, the system voltage corresponding to the power amplification unit in the loudspeaker box, and the voltage of the battery power-supplying unit in the loudspeaker box so as to dynamically supply power for the power amplification unit in the loudspeaker box; when the power amplification power required by the loudspeaker box is less than the power supply power, the power supply power-supplying, unit is only started to supply power for the power amplification unit in the loudspeaker box; when the power supply power-supplying unit supplies power, the power supply power-supplying unit performs charging when the voltage of the battery power-supplying unit is low, and charging for the power supply power-supplying unit is stopped when the voltage of the battery power-supply unit is high; and when the power amplification power required by the loudspeaker box is greater than or equal to the power supply power, the power supply power-supplying unit and the battery power-supply unit may be started to supply power for the power amplification unit, so that work can be performed when the power is greater than the power supply power. It can be seen from the above power supplying method that the power supply power-supplying unit serves as main power supply; only when an audio current is high, that is high power amplification efficiency is required, the battery power-supplying unit can be started for auxiliary power supply so as to meet the high-power requirement; when the audio current is low, the power supply power-supplying unit will automatically charge the battery power-supplying unit; therefore, the battery power-supplying unit is always kept in a state with electricity and without feed, most of the working states of the battery power-supplying unit are shallow charging and shallow discharging, the service life is long, a small-capacity battery is only required to meet the requirement, and the manufacturing cost is low.

The hybrid power supply-based high-power loudspeaker box provided by the present disclosure has the advantages of simple structure, reasonable design and high output power. The loudspeaker box is not limited by the voltage of an external power-supplying power supply. Under the assistance of the internal battery power-supplying unit, the maximum output power can be much higher than the power of the external power-supplying power supply, so that the problem that the power of the loudspeaker box is limited is effectively solved.

It should be understood that the above general description and the following detailed description are only exemplary and explanatory, and cannot limit the present disclosure.

BRIEF DESCRIPTION OF THE DRAWINGS

The accompanying drawings herein are incorporated into the specification and constitute a part of the specification, show embodiments consistent with the present disclosure, and are used to explain the principle of the present disclosure together with the specification.

To describe the technical solutions in the embodiments of the present disclosure or in the prior art more clearly, the drawings required for describing the embodiments or the prior art are described briefly below. Obviously, other drawings can be obtained by those of ordinary skill in the art based on these drawings without creative efforts.

DETAILED DESCRIPTION OF THE EMBODIMENTS

Figure 1:
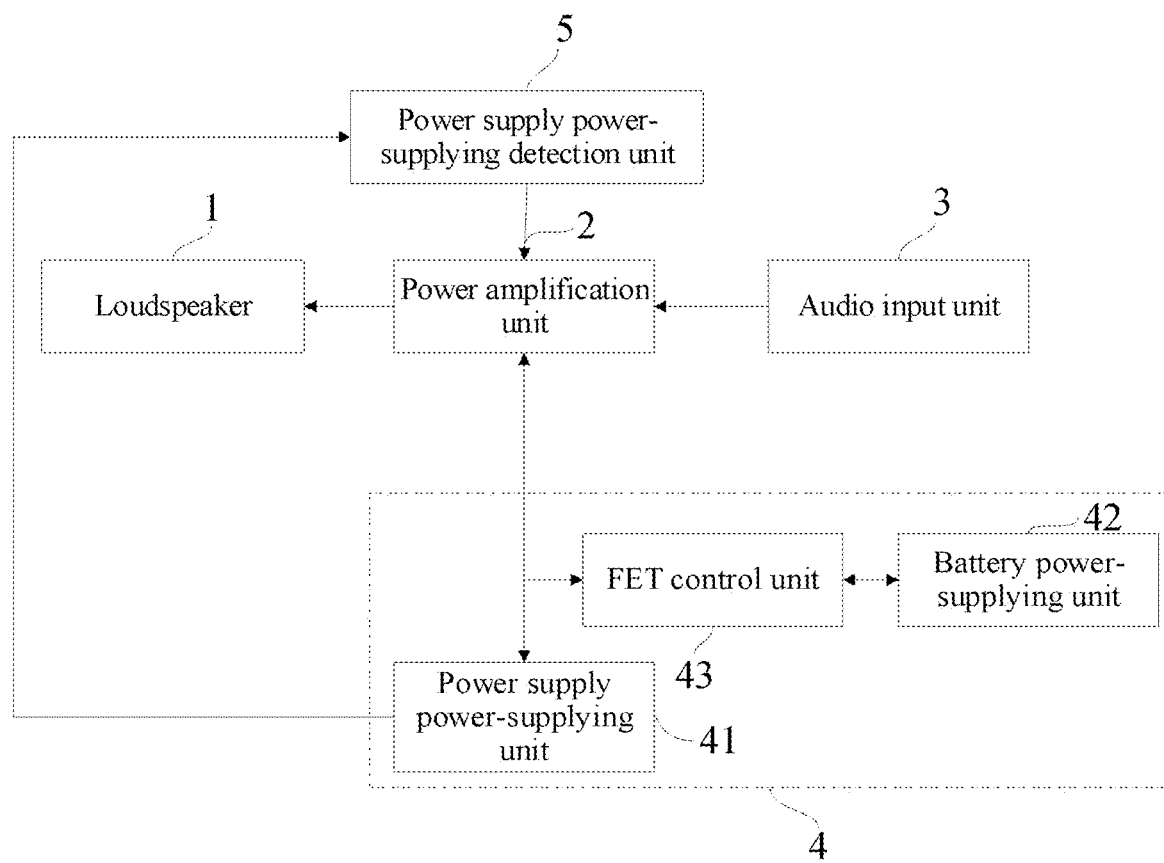
FIG. 1 is a schematic diagram of a component module of a hybrid power supply-based high-power loudspeaker box according to an embodiment of the present disclosure.

Description will be made in detail to exemplary embodiments, examples of which are illustrated in the accompanying drawings. When the following description hereinafter refers to the accompanying drawings, the same reference numerals in different drawings represent the same or similar elements, unless otherwise represented. The implementation manners described in the following exemplary examples do not represent all implementation manners consistent with the present invention. Instead, they are merely examples of apparatuses and methods consistent with some aspects of the present invention as detailed in the appended claims.

The problem that an existing USB loudspeaker box is limited by power, resulting in limiting volume and sound quality, and the problem that a loudspeaker box provided with an adapter and powered by a mains supply, resulting in high manufacturing cost of the loudspeaker box are solved. A series of studies have been made on the loudspeaker box. The audio signal is converted into an analogue audio signal after entering the loudspeaker box. The analogue audio signal is a dynamically changed current signal. The size of the current changes according to the factors such as the frequency and the intensity of the audio sound. Furthermore, the change is very great. For example, due to the difference of frequency and intensity between the gentle prelude and intense chorus in a song, the current, intensity of the audio signal can reach 10000 times as strong or weak as, possible. It is found in an experiment that the average consumed power of a USB loudspeaker box with a power supply power of 6 W is only about 3 W when music is played. Based on the above findings, this embodiment proposes to take power supply as a starting point for the first time so as to effectively solve the problem that the power is limited. Specifically, referring to FIG. 1, the hybrid power supply-based high-power loudspeaker box provided by this embodiment mainly includes an audio input unit 1, a power amplification unit 2, a loudspeaker 3 and a power supply management module 4, where the audio input unit 1 is used to receive an input audio signal; an input terminal of the power amplification unit 2 is connected to an output terminal of the audio input unit 1 and is used to receive an audio signal output by the audio input unit 1 and amplify the audio signal; an input terminal of the loudspeaker 3 is connected to an output terminal of the power amplification unit 2; the power amplification unit 2 inputs the amplified audio signal into the loudspeaker 3 and drives the loudspeaker to make a sound; the power supply management module 4 mainly includes a power supply power-supplying unit 41, a battery power-supplying unit 42 and an FET control unit 43; an input terminal of the power supply power-supplying unit 41 power supply; the battery power-supplying unit 42 is connected in series to the FET control unit 43 and then is connected to an output terminal of the power supply power-supplying unit 41; according to the power amplification power required by the power amplification unit 2 and the change of the system voltage corresponding to the power amplification unit 2, the power supply management module 4 automatically switches a conducting state of the FET control unit 43, adjusts the working sates of the battery power-supplying unit 42 and the power supply power-supplying unit 41, and dynamically supplies power for the power amplification unit 2.

The working state of the FET control unit 43 includes: forward conduction, reverse conduction and off. According to the power amplification power required by the power amplification unit 2 and the change of the system voltage corresponding to the power amplification unit 2, the power supply management module 4 automatically switches a conducting state of the FET control unit 43, adjusts the working states of the battery power-supplying unit 42 and the power supply power-supplying unit 41, and dynamically supplies power for the power amplification unit 2, which is specifically as follows:

when the power amplification power required by the power amplification unit 2 is less than the power supply power, and the voltage difference between the system voltage corresponding to the power amplification unit 2 and the voltage of the battery power-supplying unit 42 is greater than or equal to the conducting threshold of the FET control unit 43, the FET control unit 43 is forwardly conducted, and the power supply power-supplying unit 41 charges the battery power-supplying unit 42 while supplying power for the power amplification unit 2;

when the power amplification power required by the power amplification unit 2 is less than the power supply power, and the voltage difference between the system voltage corresponding to the power amplification unit 2 and the voltage of the battery power supply unit 42 is less than the conducting threshold of the FET control unit 43, the FET control unit 43 is not conducted, and the power supply power-supplying unit 41 only supplies power for the power amplification unit 2; and when the power amplification power required by the power amplification unit 2 is greater than or equal to the power supply power, and the voltage difference between the voltage of the battery power-supplying unit 42 and the system voltage corresponding to the power amplification unit 2 is greater than or equal to the conducting threshold of the FET control unit 43, the FET control unit 43 is reversely conducted, and the power supply power-supplying unit 41 and the battery power-supplying unit 42 supply power for the power amplification unit 2.

The conducting state of the FET control unit 43 is essentially automatically controlled by the difference between the voltages accessed to two terminals of the FET control unit 43. Through the above experiment, it is found that for the input audio signal of a piece of music, the currents of the corresponding audio signals are different due to the frequency and intensity of the audio sound, and the magnification times of the power amplification unit in the loudspeaker box are fixed. When the current of the input audio signal is low, the power amplification power consumed by the power amplification unit is low. As the resistance of the bias resistor is always unchanged, the voltage divided by the bias resistor is less, and the system voltage V_SYS corresponding to the power amplification unit will be high. At this time, the voltage at a position where the FET control unit is connected to the output terminal of the power supply power-supplying unit. When the battery power-supplying unit is a state of power shortage, the voltage at a position where the FET control unit is connected to the battery power-supplying unit is low. The FET control unit is forwardly conducted under the action of voltage difference between the two terminals. The power supply power-supplying unit communicate with both the power amplification unit and the battery power-supplying unit, and charges the battery power-supplying unit while supplying power for the power amplification unit. When the battery power-supplying unit is a fully charged state, the voltage at position where FET control unit is connected to the battery power-supplying unit is high, the voltage difference between the two terminals of the FET control unit is low, the FET control unit is not conducted, and the power supply power-supplying unit only communicates with the power amplification unit and only supplies power for the power amplification unit. When the current of the input audio signal is high, the power amplification power consumed by the power amplification unit is high. As the resistance of the bias resistor is always unchanged, so the voltage divided by the bias resistor is more, and the system voltage V_SYS corresponding to the power amplification unit will be low. At this time, the voltage at a position where the FET control unit is connected to the output terminal of the power supply power-supplying, unit is low, and the voltage at a position where the FET control unit is connected to the battery power-supplying unit is high. The FET control unit is reversely conducted under the action of the voltage difference between the two terminals, and the power supply power-supplying unit and the battery power-supply unit are communicated with the power amplification unit and supply power for the power amplification unit. At this time, the power amplification unit can play with high power greater than the power supply power due to the electric quantity input by the battery power-supplying unit. The power supply power in the present application refers to the power of the power supply power-supplying unit.

The loudspeaker box takes the power supply power-supplying unit as main power supply, and takes the battery power-supplying unit as auxiliary power supply. When the playing power is low, the power supply power-supplying unit supplies power for the battery power-supplying unit, and the battery power-supplying unit is in a state of shallow charging and shallow discharging in the whole power supply process. Therefore, the power supply power-supplying unit has long service life and will not affect the useful life of the loudspeaker box. Furthermore, due to low output power of the battery power-supplying unit, the requirement on the performance of the battery power-supplying unit is low, a common small-capacity battery is only required, and the cost is low. The battery power-supplying unit may select various rechargeable batteries such as a storage battery and a lithium battery.

If the power amplification unit is singly powered and played by the battery power-supplying unit, the loss of the battery power-supplying unit is large and single power supply of the battery power-supplying unit generally cannot meet sufficient power supply, so that the sound of the loudspeaker box is distorted and the playing sound quality is affected. In order to avoid the above situation, as improvement of the technical solution, referring to FIG. 1, a power supply power-supplying detection unit 5 is arranged in the USB loudspeaker box, where an input terminal of the power supply power-supplying detection unit 5 is connected to an input port of the power supply power-supplying unit 41 and is used to detect whether a power supply current input to the power supply power-supplying unit 41 is present; an output terminal of the power supply power-supplying detection unit 5 is connected to a control terminal of the power amplification unit 2; and the power supply power-supplying detection unit 5 controls whether the power amplification unit 2 is allowed to be started according to the detected external power supply current state input by the power supply power-supplying unit. Specifically, when an external power supply current is detected, the power amplification unit 2 is allowed to be started. At this time, after the loudspeaker box is turned on, the loudspeaker box normally starts. When the external power supply current is not detected, the power amplification unit 2 is not allowed to be started. At this time, even if the loudspeaker box is turned on, the loudspeaker box still cannot work normally.

The high-power loudspeaker may be applied to a USB loudspeaker box, or may be applied to a loudspeaker provided with an adapter and powered by a mains supply.

When the high-power loudspeaker box is applied to the USB loudspeaker box, the problem that the USB loudspeaker box is limited by power can be effectively solved. In general, the voltage powered by the USB interface is 5V, and the power supply power of the corresponding loudspeaker box is 6 W. By adoption of the technical solution, the loudspeaker box is provided with the power supply power-supplying unit and is further provided with a single 18650 lithium battery serving as the battery power-supplying unit. At this time, the power supply power-supplying unit and the battery power-supplying unit supply power for the power amplification unit. The loudspeaker box can output the power of about 12 W, and is not limited by the power supply power of 6 W. In actual use, batteries with different voltages may be configured according to actual requirements to serve as the battery power-supplying unit to meet the output of the corresponding power.

When the high-power loudspeaker box is applied to the loudspeaker powered by the mains supply and with the adapter, the cost of the loudspeaker box can be reduced. Similarly, taking the loudspeaker box with the power supply power of 36 W in the background art as an example, by the previous art, the 36 W loudspeaker box needs to be configured with a 36 W adapter with the price about 36 yuan. However, by adoption of the above solution, the 36 W loudspeaker box may be configured with a 18 W adapter, and a group of 18 W battery is internally provided to serve as the battery power-supplying unit. At this time, when the power supply power-supplying unit and the battery power-supplying unit supply power for the power amplification unit, the maximum output power still can reach 36 W, and the corresponding cost is about 24 yuan. The 18 W adapter is 18 yuan, and the 18 W battery pack is 6 yuan, so the manufacturing cost is reduced on the basis of ensuring the original power output.

Figure 2:
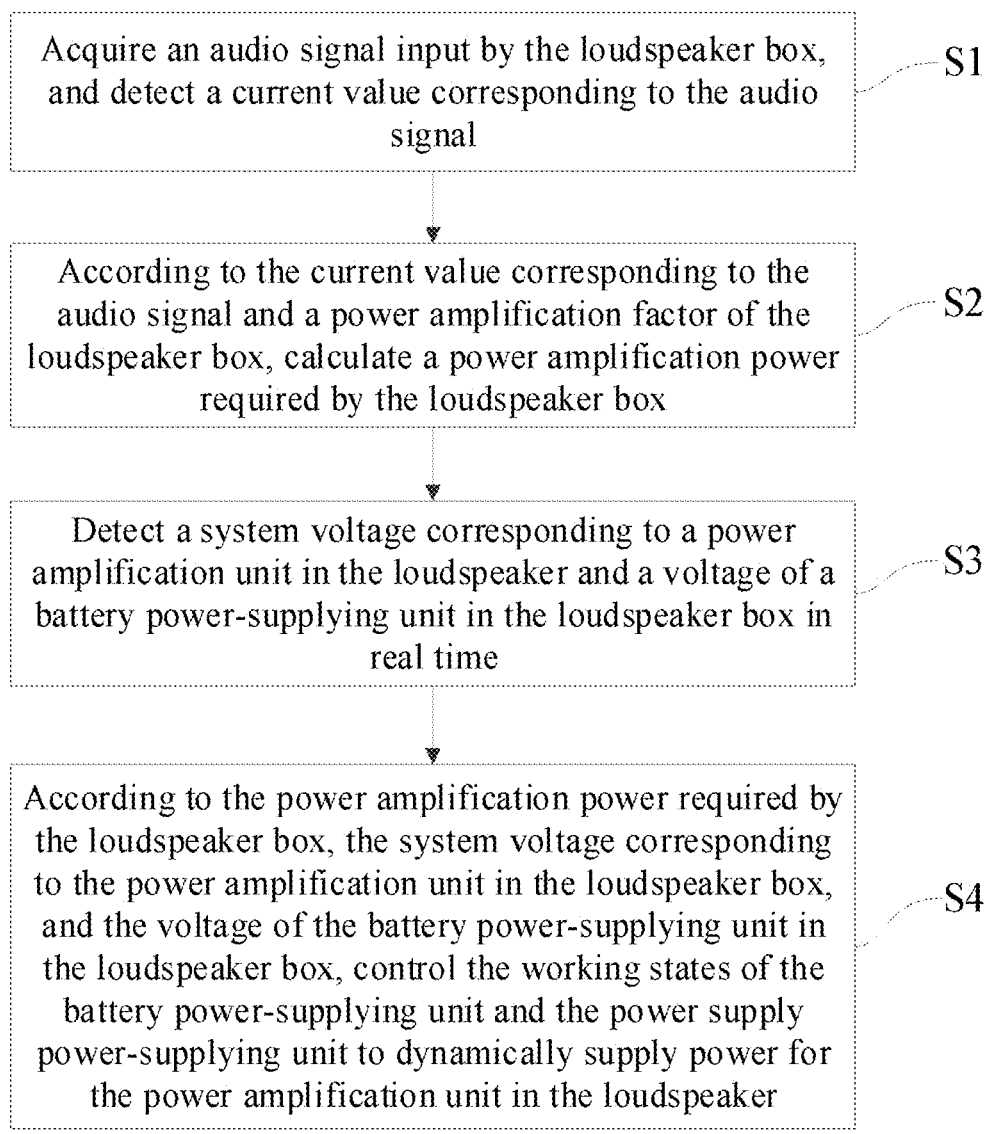
FIG. 2 is a schematic flowchart of a hybrid power supply-based power supplying method for increasing power of a loudspeaker box according to an embodiment of the present disclosure.

This embodiment further provides a hybrid power supply-based power supplying method for increasing the power of a loudspeaker. The loudspeaker is provided with a battery power-supplying unit, and a power supply power-supplying unit powered by an external power supply. Referring to FIG. 2, the power supplying method includes the following steps:

S1: an audio signal input by the loudspeaker box is acquired, and a current value corresponding to the audio signal is detected;

S2: according to the current value corresponding to the audio signal and a power amplification factor of the loudspeaker box, a power amplification power required by the loudspeaker box is calculated;

S3: a system voltage corresponding to a power amplification unit in the loudspeaker and a voltage of a battery power-supplying unit in the loudspeaker box are detected in real time; and S4: according to the power amplification power required by the loudspeaker box, the system voltage corresponding to the power amplification unit in the loudspeaker box, and the voltage of the battery power-supplying unit in the loudspeaker box, the working states of the battery power-supplying unit and the power supply power-supplying unit are controlled to dynamically supply power for the power amplification unit in the loudspeaker.

In the step S4, according to the power amplification power required by the loudspeaker box, the system voltage corresponding to the power amplification unit in the loudspeaker box, and the voltage of the battery power-supplying unit in the loudspeaker box, the working states of the battery power-supplying unit and the power supply power-supplying unit are controlled to dynamically supply power for the power amplification unit in the loudspeaker, which is specifically as follows:

the power amplification power required by the loudspeaker box is compared with rated power amplification power of the loudspeaker box to obtain a power comparison result;

the system voltage corresponding to the power amplification unit in the loudspeaker box is compared with the voltage of the battery power-supplying unit in the loudspeaker box to obtain a voltage comparison result; and according to the power comparison result and the voltage comparison result, the working states of the battery power-supplying unit and the power supply power-supplying, unit are controlled to dynamically supply power for the power amplification unit in the loudspeaker box, where when the power amplification power required by the loudspeaker box is less than the rated power amplification power of the loudspeaker box, and a voltage difference between the system voltage corresponding to the power amplification unit in the loudspeaker box and the voltage of the battery power-supplying unit is greater than or equal to a threshold, the power supply power-supplying unit is controlled to charge the battery power-supplying unit while supplying power for the power amplification unit in the loudspeaker box;

when the power amplification power required by the loudspeaker box is less than the rated power amplification power of the loudspeaker box, and a voltage difference between a system voltage corresponding to the power amplification unit in the loudspeaker box and a voltage of the battery power-supplying unit is less than a threshold, the power supply power-supplying unit is controlled to only supply power for the power amplification unit in the loudspeaker box: and when the power amplification power required by the loudspeaker box is greater than or equal to the rated power amplification power of the loudspeaker box, and the voltage difference between the system voltage corresponding to the power amplification unit, in the loudspeaker box and the voltage of the battery power-supplying unit is greater than or equal to the threshold, the power supply power-supplying unit and the battery power-supplying unit are controlled to supply power for the power amplification unit in the loudspeaker box.

In order to prevent the battery power-supplying unit from singly supplying power for the power supply power-supplying unit in the loudspeaker box for work, as an improvement of the technical solution, the power supplying method further includes the following steps:

an input power supply current of the power supply power-supplying unit in the loudspeaker box is detected, and when the input power supply current is greater than a current threshold, the power amplification unit in the loudspeaker unit is allowed to be started, otherwise, the power amplification unit in the loudspeaker box is not allowed to be started.

Similarly, the power supplying method is suitable for the loudspeaker box which is a USB loudspeaker box or a loudspeaker box provided with an adapter and powered by a mains supply.

After considering the specification and practising the disclosure disclosed herein, those skilled in the art would readily conceive of other embodiments of the present disclosure. This application is intended to cover any variations, uses or adaptive changes of the present disclosure. These variations, uses or adaptive changes follow the general principle of the present disclosure and include common general knowledge or conventional technical means in the technical field that are not disclosed in the present disclosure. The specification and the embodiments are merely regarded as exemplary, and the real scope and spirit of the present disclosure are indicated by the following claims.

It should be understood that the present disclosure is not limited to the precise structure described above and shown in the drawings, and various modifications and changes may be made without departing from its scope. The scope of the present disclosure is limited only by the appended claims.

The invention claimed is:

1. A hybrid power supply-based high-power loudspeaker box, comprising:
an audio input unit, a power amplification unit, a loudspeaker, and a power supply management module,
wherein the audio input unit is used to receive an input audio signal;
an input terminal of the power amplification unit is connected to an output terminal of the audio input unit, and is used to receive an audio signal output by the audio input unit and amplify the audio signal;
an input terminal of the loudspeaker is connected to an output terminal of the power amplification unit, and the loudspeaker is driven by the amplified audio signal output by the power amplification unit to make a sound;
the power supply management module comprises a power supply power-supplying unit, a battery power-supplying unit, and an FET control unit;
an input terminal of the power supply power-supplying unit is connected to an external power supply;
the battery power-supplying unit is connected to an output terminal of the power supply power-supplying unit after being connected in series with the FET control unit; and
the power supply management module automatically switches a conducting state of the FET control unit according to a power amplification power required by the power amplification unit and a change of a system voltage corresponding to the power amplification unit, adjusts working states of the battery power-supplying unit and the power supply power-supplying unit, and dynamically supplies power for the power amplification unit.

2. The hybrid power supply-based high-power loudspeaker box according to claim 1, wherein the conducting state of the FET control unit comprises: forward conduction, reverse conduction and non-conduction.

3. The hybrid power supply-based high-power loudspeaker box according to claim 1, wherein the power supply management module automatically switches the conducting state of the FET control unit according to the power amplification power required by the power amplification unit and the change of a system voltage corresponding to the power amplification unit, adjusts the working states of the battery power-supplying unit and the power supply power-supplying unit, and dynamically supplies power for the power amplification unit, which is specifically as follows:
when the power amplification power required by the power amplification unit is less than the power supply power, and a voltage difference between the system voltage corresponding to the power supply power-supplying unit and the voltage of the battery power-supplying unit is greater than or equal to a conducting threshold of the FET control unit, the FET control unit is forwardly conducted, and the power supply power-supplying unit charges the battery power-supplying unit while supplying power for the power supply power-supplying unit;
when the power amplification power required by the power amplification unit is less than the power supply power, and the voltage difference between the system voltage corresponding to the power amplification unit and the voltage of the battery power-supplying unit is less than the conducting threshold of the FET control unit, the FET control unit is not conducted, and the power supply power-supplying unit supplies power only for the power amplification unit; and
when the power amplification power required by the power amplification unit is greater than or equal to the power supply power, and a voltage difference between the voltage of the battery power-supplying unit and the system voltage corresponding to the power amplification unit is greater than or equal to the conducting threshold of the FET control unit, the FET control unit is reversely conducted, and the power supply power-supplying unit and the battery power-supplying unit supply power for the power amplification unit.

4. The hybrid power supply-based high-power loudspeaker box according to claim 1, further comprising: a power supply power-supplying detection unit,
wherein an input terminal of the power supply power-supplying detection unit is connected to an input port of the power supply power-supplying unit and is used to detect whether a power supply current input to the power supply power-supplying unit is present; an output terminal of the power supply power-supplying detection unit is connected to a control terminal of the power amplification unit; and the power supply power-supplying detection unit controls whether the power amplification unit is allowed to be started according to the detected external power supply current state input by the power supply power-supplying unit.

5. The hybrid power supply-based high-power loudspeaker box according to claim 1, wherein the high-power loudspeaker box is a USB loudspeaker box or a loudspeaker box provided with an adapter and powered by a mains supply.

6. A hybrid power supply-based power supplying method for increasing the power of a loudspeaker box, wherein a battery power-supplying unit and a power supply power-supplying unit powered by an external power supply are arranged in the loudspeaker box; and
the power supplying method comprises the following steps:
acquiring an audio signal input by the loudspeaker box, and detecting a current value corresponding to the audio signal,
according to the current value corresponding to the audio signal and a power amplification factor of the loudspeaker box, calculating a power amplification power required by the loudspeaker box,
detecting a system voltage corresponding to a power amplification unit in the loudspeaker and a voltage of a battery power-supplying unit in the loudspeaker box in real time, and
according to the power amplification power required by the loudspeaker box, the system voltage corresponding to the power amplification unit in the loudspeaker box, and the voltage of the battery power-supplying unit in the loudspeaker box, controlling working states of the battery power-supplying unit and the power supply power-supplying unit to dynamically supply power for the power amplification unit in the loudspeaker box.

7. The hybrid power supply-based power supplying method for increasing the power of the loudspeaker box according to claim 6, wherein the step of according to the power amplification power required by the loudspeaker box, the system voltage corresponding to the power amplification unit in the loudspeaker box, and the voltage of the battery power-supplying unit in the loudspeaker box, controlling the working states of the battery power-supplying unit and the power supply power-supplying unit to dynamically supply power for the power amplification unit in the loudspeaker box specifically comprises:
comparing the power amplification power required by the loudspeaker box with a rated power amplification power of the loudspeaker box to obtain a power comparison result;
comparing the system voltage corresponding to the power amplification unit in the loudspeaker box with the voltage of the battery power-supplying unit in the loudspeaker box to obtain a voltage comparison result; and
according to the power comparison result and the voltage comparison result, controlling the working states of the battery power-supplying unit and the power supply power-supplying unit to dynamically supply power for the power amplification unit in the loudspeaker box.

8. The hybrid power supply-based power supplying method for increasing the power of the loudspeaker box according to claim 7, wherein the step of according to the power comparison result and the voltage comparison result, controlling the working states of the battery power-supplying unit and the power supply power-supplying unit to dynamically supply power for the power amplification unit in the loudspeaker box specifically comprises:
when the power amplification power required by the loudspeaker box is less than the rated power amplification power of the loudspeaker box, and a voltage difference between the system voltage corresponding to the power amplification unit in the loudspeaker box and the voltage of the battery power-supplying unit is greater than or equal to a threshold, controlling the power supply power-supplying unit to charge the battery power-supplying unit while supplying power for the power amplification unit in the loudspeaker box;
when the power amplification power required by the loudspeaker box is less than the rated power amplification power of the loudspeaker box, and the voltage difference between the system voltage corresponding to the power amplification unit in the loudspeaker box and the voltage of the battery power-supplying unit is less than the threshold, controlling the power supply power-supplying unit to supply power only for the power amplification unit in the loudspeaker unit; and
when the power amplification power required by the loudspeaker box is greater than or equal to the rated power amplification power of the loudspeaker box, and the voltage difference between the system voltage corresponding to the power amplification unit in the loudspeaker box and the voltage of the battery power-supplying unit is greater than or equal to the threshold, controlling both the power supply power-supplying unit and the battery power-supplying unit to supply power for the power amplification unit in the loudspeaker box.

9. The hybrid power supply-based power supplying method for increasing the power of the loudspeaker box according to claim 6, further comprising the following steps:
detecting an input power supply current of the power supply power-supplying unit in the loudspeaker box, and when the input power supply current is greater than a current threshold, allowing the power amplification unit in the loudspeaker unit to be started, otherwise, not allowing the power amplification unit in the loudspeaker box to be started.

10. The hybrid power supply-based high-power loudspeaker box according to claim 6, wherein the loudspeaker box is a USB loudspeaker box or a loudspeaker box provided with an adapter and powered by a mains supply.

* * * * *